(12) United States Patent
Sisk

(10) Patent No.: US 9,318,781 B2
(45) Date of Patent: Apr. 19, 2016

(54) PREDICTED SENSOR INFORMATION FOR A BATTERY

(71) Applicant: Johnson Controls Technology Company, Holland, MI (US)

(72) Inventor: Brian C. Sisk, Mequon, WI (US)

(73) Assignee: Johnson Controls Technology Company, Holland, MI (US)

( * ) Notice: Subject to any disclaimer, the term of this patent is extended or adjusted under 35 U.S.C. 154(b) by 209 days.

(21) Appl. No.: 14/014,243

(22) Filed: Aug. 29, 2013

(65) Prior Publication Data
US 2014/0199569 A1    Jul. 17, 2014

Related U.S. Application Data

(60) Provisional application No. 61/751,425, filed on Jan. 11, 2013, provisional application No. 61/800,128, filed on Mar. 15, 2013.

(51) Int. Cl.
| | |
|---|---|
| *H01M 10/48* | (2006.01) |
| *B60L 3/00* | (2006.01) |
| *B60L 11/18* | (2006.01) |
| *H02J 7/00* | (2006.01) |

(Continued)

(52) U.S. Cl.
CPC ............ *H01M 10/482* (2013.01); *B60L 3/0046* (2013.01); *B60L 11/1866* (2013.01); *B60L 11/1877* (2013.01); *B60L 11/1879* (2013.01); *G01R 31/3606* (2013.01); *H01M 10/48* (2013.01); *H02J 7/00* (2013.01); *B60L 2240/545* (2013.01); *B60L 2240/547* (2013.01); *B60L 2240/549* (2013.01); *B60L 2260/44* (2013.01); *B60L 2260/50* (2013.01); *G01R 31/3651* (2013.01); *G01R 31/3658* (2013.01); *H01M 10/4207* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 5,321,626 A | 6/1994 | Palladino | |
| 6,594,620 B1 | 7/2003 | Qin et al. | |

(Continued)

FOREIGN PATENT DOCUMENTS

| | | |
|---|---|---|
| DE | 102005029096 A1 | 1/2007 |
| DE | 102010045514 A1 | 3/2012 |

OTHER PUBLICATIONS

Wenger, WO 2006/136475, Derwent 2007-207176 English translation, Motor vehicle's battery parameter determining method, involves measuring two voltages falling to two groups of battery cells, and calculating battery parameter of third cell group based on measured voltages of two former cell groups, Dec. 28, 2006.*

(Continued)

*Primary Examiner* — Patrick Ryan
*Assistant Examiner* — Jose Colucci Rios
(74) *Attorney, Agent, or Firm* — Fletcher Yoder, P.C.

(57) ABSTRACT

A computer-implemented method for predicting a value of a cell parameter is provided, wherein the cell is one of a plurality of cells of a battery pack. The method includes determining which other different conditions of the cell and which similar and/or different conditions of any other cell of the plurality of cells correlate with the cell condition, determining values of one or more parameters from the same cell or any other cell of the plurality of cells that correspond to the determined conditions that correlate with the cell condition, and predicting the value of the cell parameter based on the determined values.

19 Claims, 10 Drawing Sheets

(51) Int. Cl.
*G01R 31/36* (2006.01)
*H01M 10/42* (2006.01)

(56) References Cited

U.S. PATENT DOCUMENTS

| | | | |
|---|---|---|---|
| 7,710,119 | B2 | 5/2010 | Bertness |
| 7,876,071 | B2 | 1/2011 | Chen et al. |
| 8,951,671 | B1 * | 2/2015 | Nemeth ............... C07F 19/00 423/440 |
| 2001/0000212 | A1 | 4/2001 | Reipur et al. |
| 2007/0096689 | A1 | 5/2007 | Wozniak |
| 2009/0189613 | A1 * | 7/2009 | Plett ............... G01R 31/3624 324/426 |
| 2010/0321025 | A1 * | 12/2010 | Lin ............... H01M 10/441 324/427 |
| 2012/0150503 | A1 | 6/2012 | Haupt et al. |
| 2012/0310565 | A1 | 12/2012 | Redey |
| 2014/0092375 | A1 * | 4/2014 | Raghavan ............ G01L 1/246 356/32 |

OTHER PUBLICATIONS

Hofmann, WO 2012/034668, Derwent 2012-D14561 English translation, Method for operating motor vehicle e.g. electric vehicle, involves estimating terminal voltage and/or temperature of cells based on terminal voltage and/or temperature of cells of energy storage in case of failure of sensors, Mar. 22, 2012.*
International Search Report and Written Opinion for PCT Application No. PCT/US2013/077193 dated May 21, 2014; 10 pgs.

* cited by examiner

PREDICTED SENSOR INFORMATION FOR A BATTERY

CROSS-REFERENCE TO RELATED APPLICATIONS

The present application claims priority under 35 U.S.C. §119(e) to U.S. Provisional Patent Application Ser. No. 61/751,425 filed Jan. 11, 2013, and to U.S. Provisional Patent Application Ser. No. 61/800,128 filed Mar. 15, 2013, both of which are incorporated herein by reference in their entirety.

BACKGROUND

Unless otherwise indicated herein, the materials described in this section are not prior art to the claims in this application and are not admitted to be prior art by inclusion in this section.

A vehicle that uses one or more battery systems for supporting propulsion, start stop, and/or regenerative braking functions can be referred to as an xEV, where the term "xEV" is defined herein to include all of the below described electrical vehicles, or any variations or combinations thereof.

A "start-stop vehicle" is defined as a vehicle that can disable the combustion engine when the vehicle is stopped and utilize a battery (energy storage) system to continue powering electrical consumers onboard the vehicle, including the entertainment system, navigation, lights, or other electronics, as well as to restart the engine when propulsion is desired. A lack of brake regeneration or electrical propulsion distinguishes a "start-stop vehicle" from other forms of xEVs.

As will be appreciated by those skilled in the art, hybrid electric vehicles (HEVs) combine an internal combustion engine (ICE) propulsion system and a battery-powered electric propulsion system, such as 48 volt, 130 volt, or 300 volt systems. The term HEV may include any variation of a hybrid electric vehicle, in which features such as brake regeneration, electrical propulsion, and stop-start are included.

A specific type of xEV is a micro-hybrid vehicle ("mHEV" or "micro-HEV"). Micro-HEV vehicles typically operate at low voltage, which is defined to be under 60V. Micro-HEV vehicles typically provide start stop, and distinguish themselves from "start-stop vehicles" through their use of brake regeneration. The brake regeneration power can typically range from 2 kW to 12 kW at peak, although other values can occur as well. A Micro-HEV vehicle can also provide some degree of electrical propulsion to the vehicle. If available, the amount of propulsion will not typically be sufficient to provide full motive force to the vehicle.

Full hybrid systems (FHEVs) and Mild hybrid systems (Mild-HEVs) may provide motive and other electrical power to the vehicle using one or more electric motors, using only an ICE, or using both. FHEVs are typically high-voltage (>60V), and are usually between 200V and 400V. Mild-HEVs typically operate between 60V and 200V. Depending on the size of the vehicle, a Mild-HEV can provide between 10-20 kW of brake regeneration or propulsion, while a FHEV provides 15-100 kW. The Mild-HEV system may also apply some level of power assist, during acceleration for example, to supplement the ICE, while the FHEV can often use the electrical motor as the sole source of propulsion for short periods, and in general uses the electrical motor as a more significant source of propulsion than does a Mild-HEV.

In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of xEV that include all-electric or battery electric vehicles (BEVs), plug-in hybrid electric vehicles (PHEVs), and electric vehicle conversions of hybrid electric vehicles and conventional ICE vehicles. BEVs are driven entirely by electric power and lack an internal combustion engine. PHEVs have an internal combustion engine and a source of electric motive power, with the electric motive power capable of providing all or nearly all of the vehicle's propulsion needs. PHEVs can utilize one or more of a pure electric mode ("EV mode"), a pure internal combustion mode, and a hybrid mode.

xEVs as described above may provide a number of advantages as compared to more traditional gas-powered vehicles using only ICEs and traditional electrical systems, which are typically 12 volt systems powered by a lead acid battery. For example, xEVs may produce fewer undesirable emission products and may exhibit greater fuel efficiency as compared to traditional vehicles and, in some cases, such xEVs may eliminate the use of gasoline entirely, as is the case of certain types of BEVs.

As xEV technology continues to evolve, there is a need to provide improved power sources (e.g., battery systems or modules) for such vehicles. For example, it is desirable to increase the distance that such vehicles may travel without the need to recharge the batteries. Additionally, it may also be desirable to improve the performance of such batteries and to reduce the cost associated with the battery systems.

Conventional xEVs have been found to be functionally limited by their electric energy systems that supply power to their electric motor/generator and vehicle accessories. Typically, an electric motor is powered by an energy source that needs to store energy suitable for high-power discharges as well as for electric demands generated by various driving conditions.

Various configurations of battery packs are known for housing a plurality of energy-storing cells. Typically, the cells are fitted internally into containers, such as cell canisters. In addition to cell canisters, typical battery packs include a plurality of cells that can be arranged into one or more modules, cooling apparatus, electrical connection system, and electronic circuitry. Battery packaging materials may include battery pack enclosure and module containers. The electrical connection system may include bus bars. The electronic circuitry may include traceboards, cell supervisory controllers, and battery management system. The cooling apparatus, if included, may include one or more cooling channels, a thermal plate or fins, and a fan.

Moreover, a rechargeable battery pack may include a plurality of sensing units, each of which may be coupled to a set of cells, and configured to monitor conditions of the corresponding set of cells. However, conditions of a cell or of a set of cells that are not coupled to a sensing unit are as a result not known. There is a great deal of information that can be gleaned from batteries, such as current, voltage, and temperatures, that can be used to improve the function of the battery pack. However, sensors can be costly, and a common design tradeoff involves the removal of sensors, even though the sensors in question might be beneficial to operation.

Therefore, there exists a need for a battery pack that can provide information regarding conditions of cells including those that have missing or failed sensing units.

SUMMARY

Disclosed herein are improved energy storage and sensing batteries that predict conditions of cells that may be completely unmonitored or that lack specific monitoring sensors.

In one aspect, an embodiment of a computer-implemented method for predicting a value of a cell parameter is provided, wherein the cell is one of a plurality of cells of a battery pack. The method includes determining which other different conditions of the cell and which similar and/or different conditions of any other cell of the plurality of cells correlate with the cell condition, determining values of one or more parameters from the same cell or any other cell of the plurality of cells that correspond to the determined conditions that correlate with the cell condition, and predicting the value of the cell parameter based on the determined values.

In another aspect, a battery pack includes a first plurality of cells, each of which includes a sensing unit for sensing a cell parameter and generating a value corresponding to the sensed cell parameter, and a second plurality of cells that are not equipped with similar sensing units. The battery pack further includes a battery management system coupled to the sensing units and includes a module configured to predict values of parameters of the second plurality of cells based on the parameter values generated by the sensing units of the first plurality of cells.

In yet another aspect, a computing system includes a processing unit and a memory unit for storing instructions that are operable, when executed by the processing unit, to perform a method for predicting a value of a cell parameter, the cell being one of a plurality of cells of a battery pack.

These as well as other aspects, advantages, and alternatives will become apparent to those of ordinary skill in the art by reading the following detailed description, with reference where appropriate to the accompanying drawings. Further, it should be understood that the disclosure provided in this summary section and elsewhere in this document is intended to discuss the embodiments by way of example only and not by way of limitation.

BRIEF DESCRIPTION OF THE FIGURES

These and other features, aspects, and advantages of the present disclosure will become better understood when the following detailed description is read with reference to the accompanying drawings in which like characters represent like parts throughout the drawings, wherein.

DETAILED DESCRIPTION OF THE DRAWINGS

Figure 1:
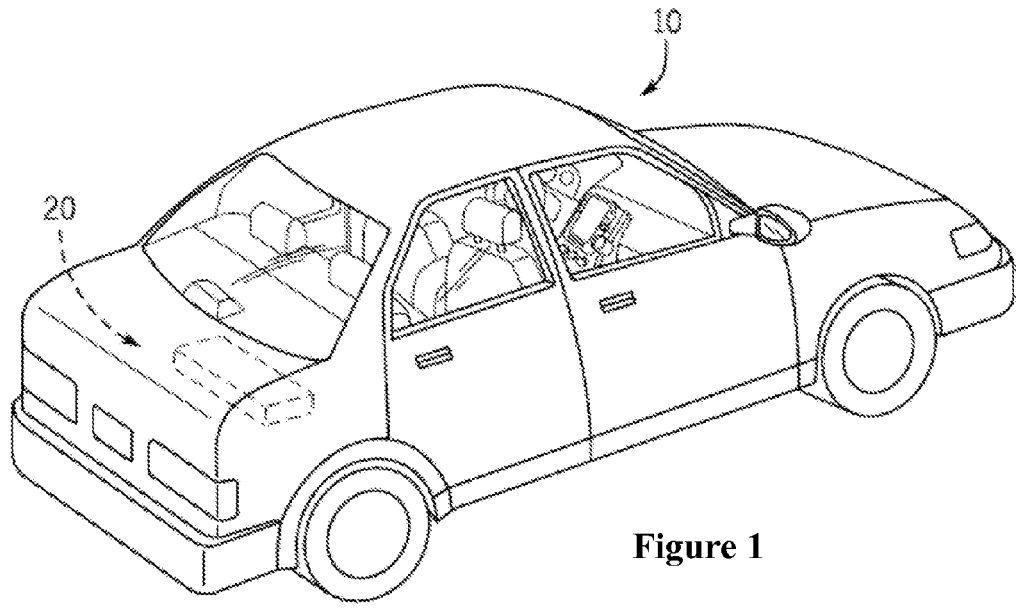
FIG. 1 is a perspective view of a vehicle (an xEV) having a battery system contributing all or a portion of the power for the vehicle, in accordance with an embodiment of the present approach.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

As discussed above, there are several different types of xEVs. Although some vehicle manufacturers, such as Tesla, produce only xEVs and, thus, can design the vehicle from scratch as an xEV, most vehicle manufacturers produce primarily traditional internal combustion vehicles. Thus, when one of these manufacturers also desires to produce an xEV, it often utilizes one of its traditional vehicle platforms as a starting point. As can be appreciated, when a vehicle has been initially designed to use a traditional electrical system powered by a single lead acid battery and to utilize only an internal combustion engine for motive power, converting such a vehicle into its HEV version can pose many packaging problems. For example, a FHEV uses not only these traditional components, but one or more electric motors must be added along with other associated components. As another example, a mHEV also uses not only these traditional components, but a higher voltage battery (e.g., a 48V lithium ion battery module) must be placed in the vehicle to supplement or replace the 12V lead acid battery along with other components such as a belt integrated starter-generator, sometimes referred to as a belt alternator starter (BAS) as described in further detail below. Hence, if a battery system can be designed to reduce such packaging problems, it would make the conversion of a traditional vehicle platform into an xEV less costly and more efficient. As used herein, the BAS is not intended to be limited to a belt-driven alternator starter, as other types of drives could be used.

The battery systems described herein may be used to provide power to a number of different types of xEVs as well as other energy storage applications (e.g., electrical grid power storage systems). Such battery systems may include one or more battery modules, each battery module having a number of battery cells (e.g., lithium ion electrochemical cells) arranged to provide particular voltages and/or currents useful to power, for example, one or more components of an xEV. Presently disclosed embodiments include lithium ion battery modules that are capable of providing more than one voltage. In particular, certain disclosed battery systems may provide a first voltage (e.g., 12V), for example, to power ignition of a combustion engine using a traditional starter motor and/or support conventional 12V accessory loads, and may provide a second voltage (e.g., 48V), for example, to power a BAS and to power one or more vehicle accessories when the combustion engine is not running, for use in a micro-hybrid system for example. Indeed, in certain embodiments, not only may a single battery system provide two voltages (e.g., 12V and 48V), but it can provide them from a package having a form factor equivalent to a traditional lead acid 12V battery, thus making packaging and conversion of a traditional vehicle to a mHEV simpler, less costly and more efficient.

Present embodiments also include physical battery module features, assembly components, manufacturing and assembling techniques, and so forth, that facilitate providing disclosed battery modules and systems that have a desired form factor (e.g., dimensions corresponding to a traditional lead acid battery). Further, as set forth in detail below, the disclosed battery module embodiments include a number of heat transfer devices (e.g., heat sinks, liquid-cooling blocks, heat transfer foams, phase change materials (PCMs), and so forth) that may be used to passively or actively maintain one or more temperatures of the battery module during operation.

With the foregoing in mind, FIG. 1 is a perspective view of an xEV 10 in the form of an automobile (e.g., a car) having a battery system 20 in accordance with present embodiments for providing all or a portion of the power (e.g., electrical power and/or motive power) for the vehicle 10, as described above. Although the xEV 10 may be any of the types of xEVs described above, by specific example, the xEV 10 may be a mHEV, including an internal combustion engine equipped with a micro-hybrid system which includes a start-stop system that may utilize the battery system 20 to power at least one or more accessories (e.g., AC, lights, consoles, etc.), as well as the ignition of the internal combustion engine, during start-stop cycles.

Further, although the xEV 10 is illustrated as a car in FIG. 1, the type of vehicle may differ in other embodiments, all of which are intended to fall within the scope of the present disclosure. For example, the xEV 10 may be representative of a vehicle including a truck, bus, industrial vehicle, motorcycle, recreational vehicle, boat, or any other type of vehicle that may benefit from the use of electric power. Additionally, while the battery system 20 is illustrated in FIG. 1 as being positioned in the trunk or rear of the vehicle, according to other embodiments, the location of the battery system 20 may differ. For example, the position of the battery system 20 may be selected based on the available space within a vehicle, the desired weight balance of the vehicle, the location of other components used with the battery system 20 (e.g., battery management systems, vents or cooling devices, etc.), and a variety of other considerations.

Figure 2:
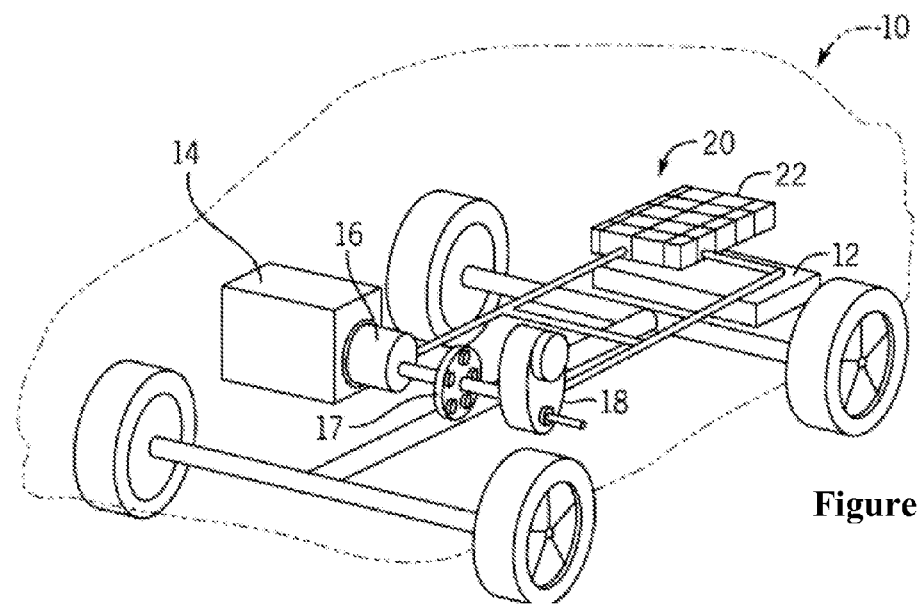
FIG. 2 is a cutaway schematic view of the xEV embodiment of FIG. 1 in the form of a hybrid electric vehicle (HEV), in accordance with an embodiment of the present approach.

FIG. 2 illustrates a cutaway schematic view of an embodiment of the xEV 10 of FIG. 1, provided in the form of an HEV having the battery system 20, which includes one or more battery modules 22. In particular, the battery system 20 illustrated in FIG. 2 is disposed toward the rear of the vehicle 10 proximate a fuel tank 12. In other embodiments, the battery system 20 may be provided immediately adjacent the fuel tank 12, provided in a separate compartment in the rear of the vehicle 10 (e.g., a trunk), or provided in another suitable location in the xEV 10. Further, as illustrated in FIG. 2, an internal combustion engine 14 may be provided for times when the xEV 10 utilizes gasoline power to propel the vehicle 10. The vehicle 10 also includes an electric motor 16, a power split device 17, and a generator 18 as part of the drive system.

The xEV vehicle 10 illustrated in FIG. 2 may be powered or driven by the battery system 20 alone, by the combustion engine 14 alone, or by both the battery system 20 and the engine 14. It should be noted that, in other embodiments of the present approach, other types of vehicles and configurations for the vehicle drive system may be utilized, and that the schematic illustration of FIG. 2 should not be considered to limit the scope of the subject matter described in the present application. According to various embodiments, the size, shape, and location of the battery system 20, the type of vehicle, the type of xEV technology, and the battery chemistry, among other features, may differ from those shown or described.

The battery system 20 may generally include one or more battery modules 22, each having a plurality of battery cells (e.g., lithium ion electrochemical cells), which are discussed in greater detail below. The battery system 20 may include features or components for connecting the multiple battery modules 22 to each other and/or to other components of the vehicle electrical system. For example, the battery system 20 may include features that are responsible for monitoring and controlling the electrical and thermal performance of the one or more battery modules 22.

Figure 3:
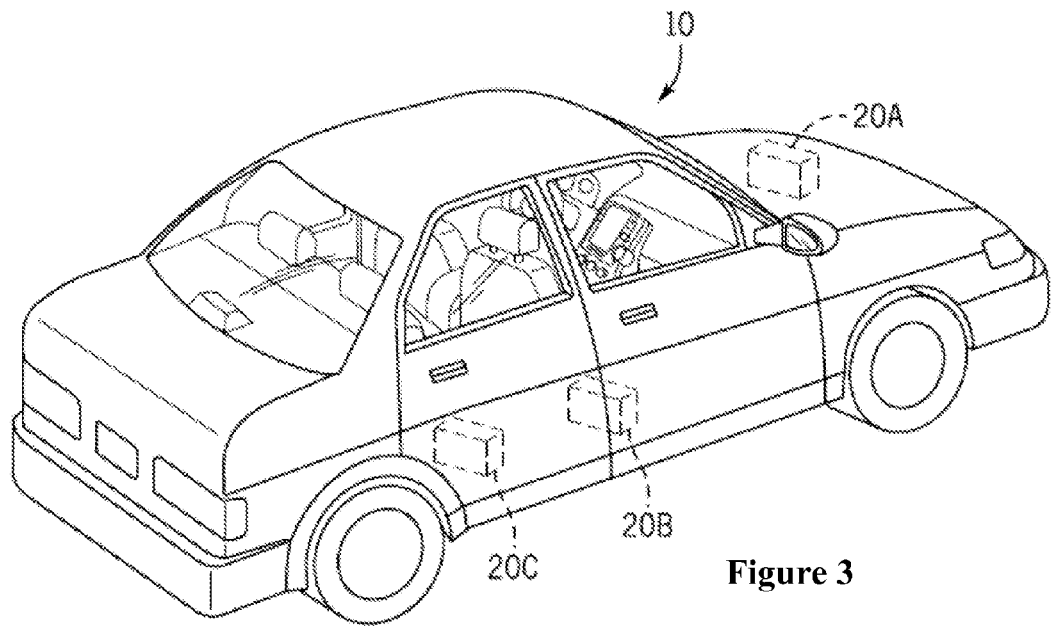
FIG. 3 is a cutaway schematic view of an embodiment of the xEV of FIG. 1 in the form of a micro-hybrid electric vehicle (mHEV), in accordance with an embodiment of the present approach.

FIG. 3 illustrates a cutaway schematic view of another embodiment of the xEV 10 of FIG. 1, provided in the form of a mHEV 10 having the battery system 20. As discussed above, the battery system 20 for use with a micro-hybrid system of an mHEV 10 may include a single battery that provides a first voltage (e.g. 12V) and a second voltage (e.g. 48V) and that is substantially equivalent in size to a traditional 12V lead acid battery used in traditional internal combustion vehicles. Hence, such a battery system 20 may be placed in a location in the mHEV 10 that would have housed the traditional battery prior to conversion to an mHEV. For example, as illustrated in FIG. 3, the mHEV 10 may include the battery system 20A positioned similarly to a lead-acid battery of a typical combustion-engine vehicle (e.g., under the hood of the vehicle 10). By further example, in certain embodiments, the mHEV 10 may include the battery system 20B positioned near a center of mass of the mHEV 10, such as below the driver or passenger seat. By still further example, in certain embodiments, the mHEV 10 may include the battery system 20C positioned below the rear passenger seat or near the trunk of the vehicle. It should be appreciated that, in certain embodiments, positioning a battery system 20 (e.g., battery system 20B or 20C) in or about the interior of the vehicle may enable the use of air from the interior of the vehicle to cool the battery system 20 (e.g., using a heat sink or a forced-air cooling design, as set forth in detail below).

Figure 4:
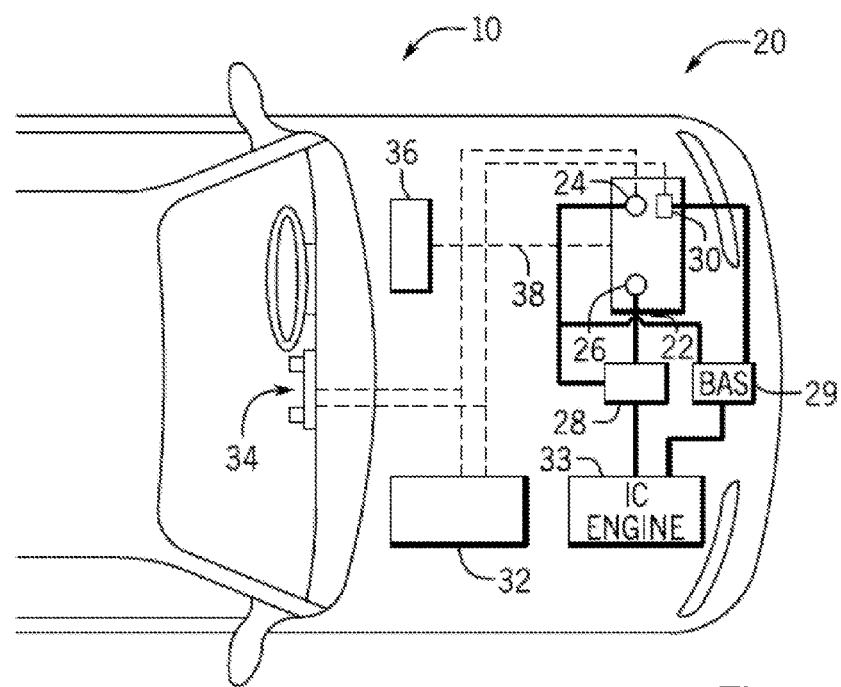
FIG. 4 is a schematic view of the mHEV embodiment of FIG. 3 illustrating power distribution throughout the mHEV, in accordance with an embodiment of the present approach.

FIG. 4 is a schematic view of an embodiment of the mHEV 10 of FIG. 3 having an embodiment of an energy system 21 disposed under the hood of the vehicle 10 and including the battery system 20. As previously noted and as discussed in detail below, the battery system 20 may further have dimensions comparable to those of a typical lead-acid battery to limit or eliminate modifications to the mHEV 10 design to accommodate the battery system 20. Further, the battery system 20 illustrated in FIG. 4 is a three-terminal battery that is capable of providing two different output voltages. For example, a first terminal 24 may provide a ground connection, a second terminal 26 may provide a 12V output, and a third terminal 30 may provide a 48V output. As illustrated, the 48V output of the battery module 22 may be coupled to a BAS 29, which may be used to start the internal combustion engine 33 during start-stop cycle, and the 12 V output of the battery module 22 may be coupled to a traditional ignition system (e.g., starter motor 28) to start the internal combustion engine 33 during instances when the BAS 29 is not used to do so. It should also be understood that the BAS 29 may also capture energy from a regenerative braking system or the like (not shown) to recharge the battery module 22.

It should be appreciated that the 48 V and 12 V outputs of the battery module 22 may also be provided to other components of the mHEV 10. Examples of components that may utilize the 48 V output in accordance with present embodiments include radiator cooling fans, climate control fans, electric power steering systems, active suspension systems, electric air-conditioning systems, auto park systems, cooled seats, electric oil pumps, electric super/turbochargers, electric water pumps, heated seats, heated windscreen/defrosters, and engine ignitions. Examples of components that may utilize the 12 V output in accordance with present embodiments include window lift motors, vanity lights, tire pressure monitoring systems, sunroof motor controls, power seats, alarm systems, infotainment online features, navigation features, lane departure warning systems, electric parking brakes, and external lights. The examples set forth above are not exhaustive and there may be overlap between the listed examples. Indeed, for example, in some embodiments, features listed above as being associated with a 48 V load may utilize the 12 V output instead and vice versa.

In the illustrated embodiment, the 48 V output of the battery module 22 may be used to power one or more accessories of the mHEV 10. For example, as illustrated in FIG. 4, the 48 V output of the battery module 22 may be coupled to the heating, ventilation, and air conditioning (HVAC) system 32 (e.g., including compressors, heating coils, fans, pumps, and so forth) of the mHEV 10 to enable the driver to control the temperature of the interior of the mHEV 10 during operation of the vehicle. This is particularly important in an mHEV 10 during idle periods when the internal combustion engine 33 is stopped and, thus, not providing any electrical power via engine charging. As also illustrated in FIG. 4, the 48 V output of the battery module 22 may be coupled to the vehicle console 34, which may include entertainment systems (e.g., radio, CD/DVD players, viewing screens, etc.), warning lights and indicators, controls for operating the mHEV 10, and so forth. Hence, it should be appreciated that the 48 V output may, in certain situations, provide a more efficient voltage at which to operate the accessories of the mHEV 10 (e.g., compared to 12 V), especially when the internal combustion engine 33 is stopped (e.g., during start-stop cycles). It should also be appreciated that, in certain embodiments, the 48 V output of the battery module 22 may also be provided to any other suitable components and/or accessories (e.g., lights, switches, door locks, window motors, windshield wipers, and so forth) of the mHEV 10.

Also, the mHEV 10 illustrated in FIG. 4 includes a vehicle control module (VCM) 36 that may control one or more operational parameters of the various components of the vehicle 10, and the VCM 36 may include at least one memory and at least one processor programmed to perform such tasks. Like other components of the mHEV 10, the battery module 22 may be coupled to the VCM 36 via one or more communication lines 38, such that the VCM 36 may receive input from the battery module 22, and more specifically, the battery control module (BCM) of the battery module 22 (discussed in detail below). For example, the VCM 36 may receive input from the battery module 22 regarding various parameters, such as state of charge and temperature, and the VCM 36 may use these inputs to determine when to charge and/or discharge the battery module 22, when to discontinue charging the battery module 22, when to start and stop the internal combustion engine 33 of the mHEV 10, whether to use the BAS 29 or the starter 28, and so forth.

As stated above, a rechargeable battery pack typically includes a plurality of cells, and sensing units (or sensors) configured to sense cell conditions and produce signals representative/indicative of levels of the sensed conditions. These sensing units may be provided to sense conditions of a corresponding subset of the plurality of cells. Alternatively, the battery pack may include a plurality of sensors, each one coupled to an individual cell, to provide a value representative of the sensed condition for the corresponding individual cell. Further, a subset of cells may be directly coupled to a number of sensors that is less than the number of conditions that should be sensed and monitored, or may not be coupled to any sensors.

Accordingly, an exemplary embodiment of a novel battery pack includes a number of rechargeable electrochemical cells and one or more different types of sensing units, each of which is coupled to one of the electrochemical cells or to a subset of the electrochemical cells, and configured to monitor conditions of the corresponding cell or subset of cells in order to generate and communicate a signal indicative of a sensed condition for communication to a battery management unit or system. The generated signals are then analyzed by the battery management system and used to predict or estimate conditions of cells that are not coupled to a specific or particular type of sensing unit and are adjacent to, neighbor to, or similar to, cells that are coupled to those corresponding sensing units.

The sensed conditions or measurable parameters may be thermal levels, voltage levels, current levels, pressure levels, internal resistance or impedance levels, or any other condition that can be monitored to maintain a desirable operating status of the battery pack, or to improve vehicle operation, safety, fuel economy, or any other favorable outcome.

The plurality of rechargeable electrochemical cells can have substantially the same capacity. Alternatively, a subset of rechargeable electrochemical cells, which are uncoupled to sensing units, may have a different capacity than that of the sensor-coupled cells. The difference in capacity may be by design (i.e., intentional) or due to cell to cell variations, which can be due to manufacturing tolerances, cell aging, or other conditions. As such, the prediction of conditions of the sensor-uncoupled cells, which are made based on sensed conditions of their neighboring sensor-coupled cells, are adjusted based on the differences in capacity levels.

Figure 5:
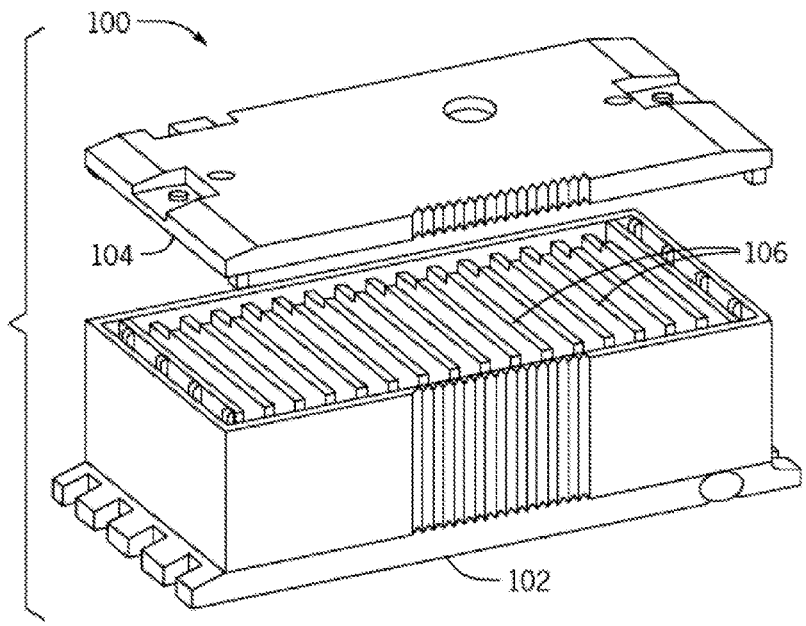
FIG. 5 illustrates an embodiment of an energy storage device.

Now referring to FIG. 5, an exemplary embodiment of an Energy Storage Sensing and Predicting/Estimating (ESSP) battery pack or apparatus 100 is shown. ESSP battery pack 100 includes a housing 102 and a cover 104. Housing 102 is configured to contain a plurality of electrochemical cells 106. Cover 104 may be formed of the same material, such as a polymer material, as that of housing 102 or any other suitable material.

Alternatively, battery pack 100 may be structured differently in terms of housing and cover, and have any other suitable configuration of the cells, sensing units, and electronic components. In another embodiment, cells 506 may not be housed together in one housing unit.

As known to one of ordinary skill in the art, a working unit in a battery pack is the electrochemical cell, which consists of a cathode, an anode, a separator, and an electrolyte. The electrolyte, which can be liquid, gel, or solid, is configured to carry ions, while the separator is configured to permit a conduction of certain ions to the exclusion of others. For certain types of batteries, during a discharge state, a positively charged ion leaves the anode and migrates through the separator to the cathode while its associated electron is collected by a current collector to be used to power a coupled electric device.

Figure 6A:
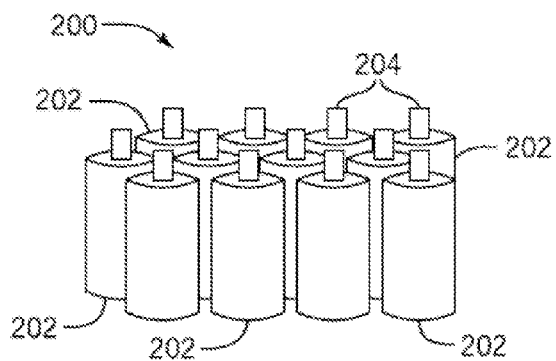
FIG. 6A is a schematic diagram illustrating an exemplary arrangement of a plurality of rechargeable cells of a battery pack, each of which is equipped with a sensing unit.

Now referring to FIG. 6A, an arrangement of a plurality of cells 202 is shown. Each of the plurality of cells 202 includes a sensing unit 204, which is configured to sense at least one of a plurality of conditions and generate values of a corresponding parameter of the associated cell. Sensing unit 204 may be configured to sense more than one condition and therefore conduct more than one parameter measurement, so that a corresponding cell or set of cells may have one or more conditions or states measured. Alternatively, each cell can be coupled to one or more sensing units.

Figure 6B:
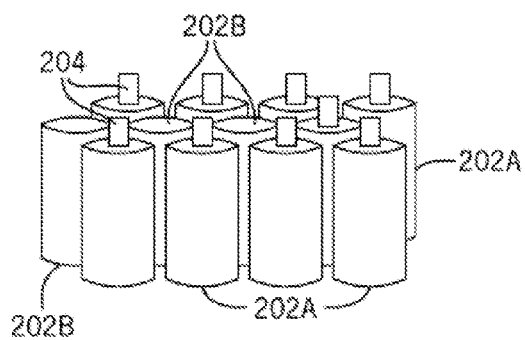
FIG. 6B is a schematic diagram illustrating a battery pack including a first plurality of rechargeable cells equipped with sensing units and a second plurality of rechargeable cells that are not equipped with sensing units.

As shown in FIG. 6B, to minimize a manufacturing cost and an overall weight of an ESSP battery pack, some of the rechargeable cells 202B may not be fitted with or coupled to one or more sensing units. As such, to overcome this reduction in the number of sensing units 604 that can translate into a reduction of sensed parameters of cells 202B, a battery management system, coupled to sensing units 204, is configured to estimate or predict cell parameters that are not directly measured.

Figure 7:
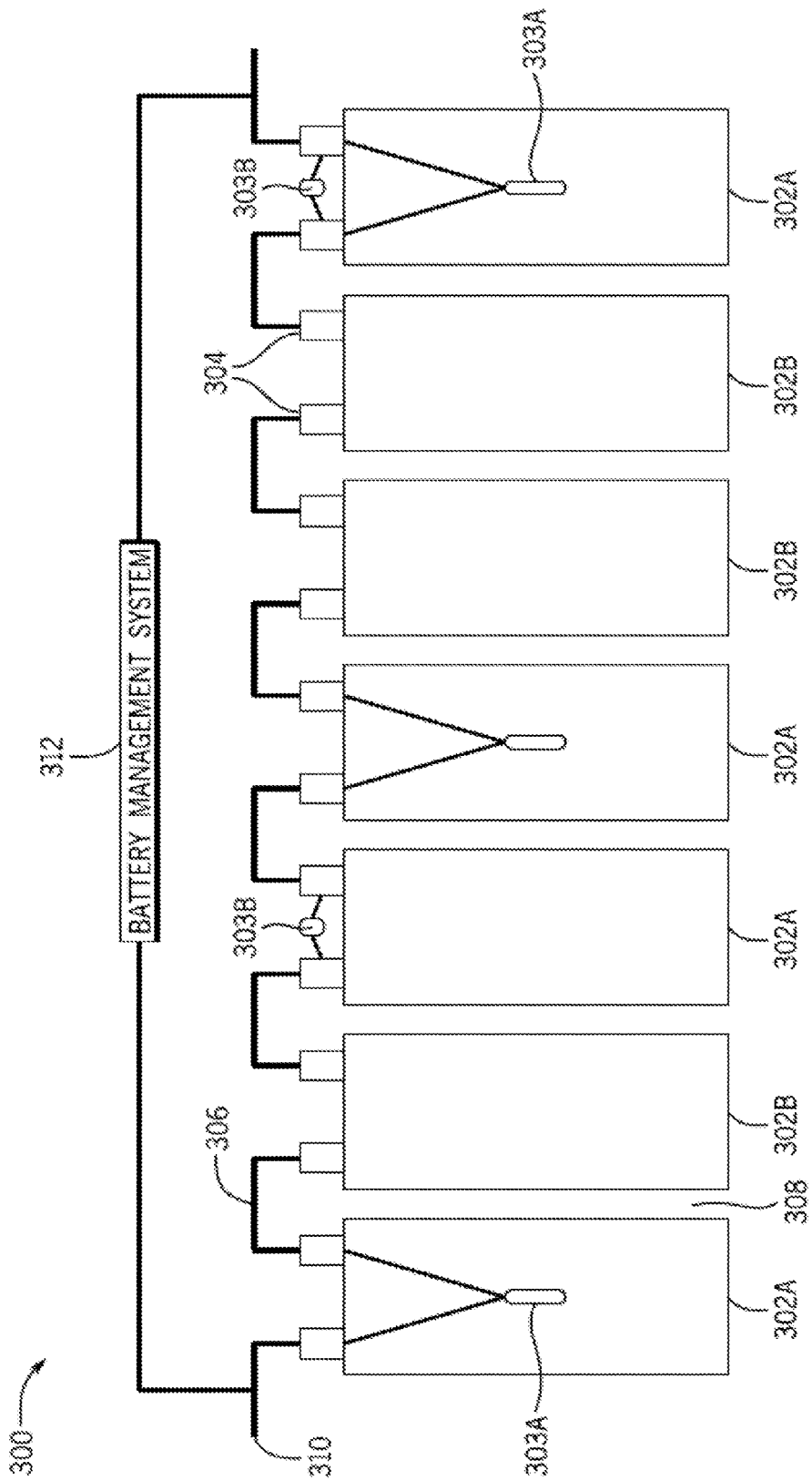
FIG. 7 is a schematic diagram of the battery pack of FIG. 6B coupled to a battery management system.

Now referring to FIG. 7, an exemplary arrangement 300 of a plurality of cells 302A and 302B within ESSP battery pack 301 is shown. Cells 302A and 302B are aligned in series and cell terminals 304 of adjacent cells are connected by inter-cell connectors 306, which are shown to bridge over cell dividers 308. Alternatively, inter-cell connectors 306 can couple cell terminals 304 in any other suitable or desirable arrangement. Though, cells 302A and 302B are shown in FIG. 7 to be aligned in series, as known to one of ordinary skill in the art, cells 302A and 302B may be connected in parallel or in a series and parallel arrangement.

As shown, each of cells 302A includes a sensing unit 303A and or a sensing unit 303B that can be coupled to cell terminals 304, and none of cells 302B includes such sensor. Alternatively, each of cells 302A may include more than two sensing units. In one embodiment, as individual cells 302A-B need to be electrically connected, inter-cell terminals can be insert-molded into the housing and the cover for connection to other cells 302A-B. In another embodiment, inter-cell electrical connections can be accomplished via any suitable connectivity technique. Further, in one embodiment, inter-cell connections can be connected to a DC power bus, a power line, or any normal/regular connecting arrangements, which can link sensing units 303A-B to a battery management system 312.

In one embodiment, as shown in FIG. 7, sensor 303A may be an in-situ sensor situated at any suitable location of each cell 302A to monitor conditions occurring within cell 302A. In another embodiment, sensors 303A may be ex-situ sensors. As shown, sensor 303B may be provided within the vicinity of a corresponding cell 302A and be suitably coupled to it for sensing purposes. An example of a sensor can be a temperature sensor that may be formed of any temperature sensitive material that offers a desirable quick response to temperature changes, and a robust, linear or proportional electronic signal response in the temperature range that is expected within cells 302A of ESSP battery pack 301. This temperature sensitive material enables the temperature sensor to produce a repeatable response that is desirably proportional with the temperature. Further, the temperature sensitive material may be sprayed or drop-cast directly to the sensor electrodes. Alternatively, the temperature sensor can be any commercial resistive material device.

When a plurality of cells are connected in series, the voltage may vary because the individual cells can have different characteristics. Then when charging, for example, the voltage in some cells may be excessive, and may cause problems such as damage or fire. As such, circuitry is generally provided to sense or estimate the voltage of each of the cells connected in series to prevent an overvoltage. In one embodiment, voltage sensors may be coupled to cell terminals. Alternatively, voltage sensors may be non-contact electrostatic voltage sensors. Similarly, current sensors may be contact or non-contact electromagnetic current sensors.

In one exemplary embodiment, battery management system 312 is configured to estimate or predict a value or level of a particular parameter of a sensor-uncoupled cell 302B based on:

(1) measured values or levels of different parameters of sensor-uncoupled cell 302B, (2) at least one sensed or measured value of the same particular parameter of one of sensor-coupled cells 302A, which may be a neighboring cell to the sensor-uncoupled cell 302B, (3) any other suitable information sensed or collected from the battery pack.

Moreover, battery management system 312 is configured to identify cells 302A that are juxtaposed (i.e., neighboring) and correlate (e.g., parameter/condition wise) with sensor-uncoupled cells 302B.

In one embodiment, during a research phase of correlated parameters, ESSP battery pack 301 is provided as a fully instrumented (e.g., fully sensed) battery pack in order to determine parameters correlations. Based on these determined correlations, some of the sensors may be removed to minimize the cost of the battery pack. Alternatively, the determined correlations may be used to estimate unmonitored conditions when their respective sensors are no longer in a working state. As such, battery management system 312 can correlate monitored parameters of cell 302B and other correlated cells with the desired immeasurable parameters of cell 302B. As stated above, the desired value or level of a particular parameter may be, but not limited to, a voltage level, a current level, a temperature level, a state of charge level, and a pressure or constraint level.

Accordingly, by using the determined correlations, battery management system 312 is configured to estimate or predict parameters of individual cells 302B and overall parameters of ESSP battery pack 301 based on cell parameters and battery pack parameters monitored by battery management system 312. As such, battery management system 312 can determine (e.g., predict or estimate) the voltage, the current, the pressure, and the internal or external temperature of an individual cell or of the battery pack at any particular time.

Further, based on the voltage determination, battery management system 312 can determine (e.g., predict or estimate) a state of charge (SOC) (i.e., remaining energy) of an individual cell or of the battery pack at a particular time. The amount of energy remaining in unmonitored individual cells 302B or in ESSP battery pack 301 at any particular time may depend on a number of parameters, including, for example, temperature levels, discharge current of the battery pack and/or of monitored cells, capacities of cells, and state of charge (SOC) of monitored cells, and the like.

One of the parameters that are required to ensure safe charging and discharging of cells 302A-B and of ESSP battery pack 301 is their corresponding SOC. A stated above and known to one of ordinary skills in the art, SOC is defined as a current/present capacity of a cell expressed in terms of its rated capacity. SOC provides the current state of cells and enables cells to be safely charged and discharged at a level suitable for cell and battery pack life enhancement. Thus, SOC helps in the management of cells and battery packs. Furthermore, because SOC is based on deriving the level of charge from the measured cell voltage and temperature parameters, rechargeable cells may exhibit varying discharge characteristics with time and temperature. As such, predictions by the battery management system of voltage and temperature parameters of a particular unmonitored cell 302B, using different measurable parameters of the particular cell 302B and/or voltage and temperature parameters of neighboring monitored cells 302A, can lead to an accurate prediction of the SOC of the particular cell 302B.

As known to one of ordinary skill in the art, a typical approach to equalization of cells (i.e., balancing their SOCs) of a battery pack is to compare terminal voltages of individual cells. Battery cells having terminal voltage higher than the others may be bucked, and battery cells having terminal voltage lower than the others may be boosted. As such, upon predicting terminal voltages of unmonitored cells 302B, the battery management system can equalize all of cells 302A and 302B in order to better manage the lifetimes of cells 302A and 302B and of ESSP battery pack 301.

Furthermore, based on temperature levels, pressure levels, and other parameters predicted for unmonitored cells 302B based on different measurable parameters of unmonitored cells 302B and measurable parameters of monitored cells 302A, battery management system 312 may predict which of the battery cells 302B may limit a performance of the battery pack and use that information to manage the battery pack accordingly. For instance, the information may be used to determine which battery cells need to be equalized during the battery charging process. As such, charging energy may not be wasted due to the transfer of energy to/from the wrong battery cells. Moreover, during charging and discharging events, the prediction of cell conditions can serve to ensure that unmonitored cells 302B are not overcharged or overdischarged. Additionally, this information can be used in the calculation of power limits, which will vary depending on SOC and temperature. Further, cell pressure can be used as an indicator of overcharging, which would be useful to predict the charge power limit.

As stated above, SOC is commonly defined as the ratio of the charge amount present in a battery cell at a certain time to its nominal capacity, i.e. the amount of charge that can be stored in the cell when it is fully charged. As known to one of ordinary skills in the art, this is typically true only at the beginning of the cell life, because the cell's actual nominal capacity gradually decreases with time. Accordingly, in one embodiment, battery management system 312 is configured to keep track of the age of an unmonitored cell 302B, its respective aging state of health, and recent performance, in order to adjust a prediction of a cell parameter value based on other parameters of the unmonitored cell 302B and/or on similar parameters of monitored cells 302A. As such, battery management system 312 is configured to take into account the entire dynamics of a cell when making a prediction about a particular unmonitored condition of the cell.

Though the above discussion revolved around the prediction of the SOC of a particular cell, a similar discussion may involve predicting one of a temperature, a pressure, and any other desirable cell parameter based on different measurable parameters of the particular cell, on similar or different measurable parameters of at least one other cell that correlates with the particular cell, or any combination of these similar and different parameters.

As shown in FIG. 7, cell terminals 304 are connected to a communication line unit 310, which enables communication of measured values of sensed conditions to battery management system 312. In one embodiment, battery management system 312 is integral or wired to ESSP battery pack 301. Alternatively, in another embodiment, battery management system 312 may be coupled communication line unit 310 via a communications link (not shown). In one arrangement, communication line unit 310 may communicate measured parameter data in an electrical wiring form, a wireless communication form, a Radio Frequency (RF) communication form, or in an optical communication form. Further, each sensing unit 303A or 303B may be integral to an integrated circuit (IC) chip (not shown) that further includes a controller that is coupled to corresponding sensing unit 303A or sensing unit 303B and communication line unit 310, and is configured to digitize a sensor signal and to communicate it to battery management system 312. The IC chip may include a micro-processing unit and a memory unit for performing and storing monitoring and controlling instructions. Thus, in this embodiment, IC chip is configured to integrate sensors 303A-B, the controller, and communication protocols, and convey a digitized sensor signal from the IC chip to battery management system 312.

Figure 8:
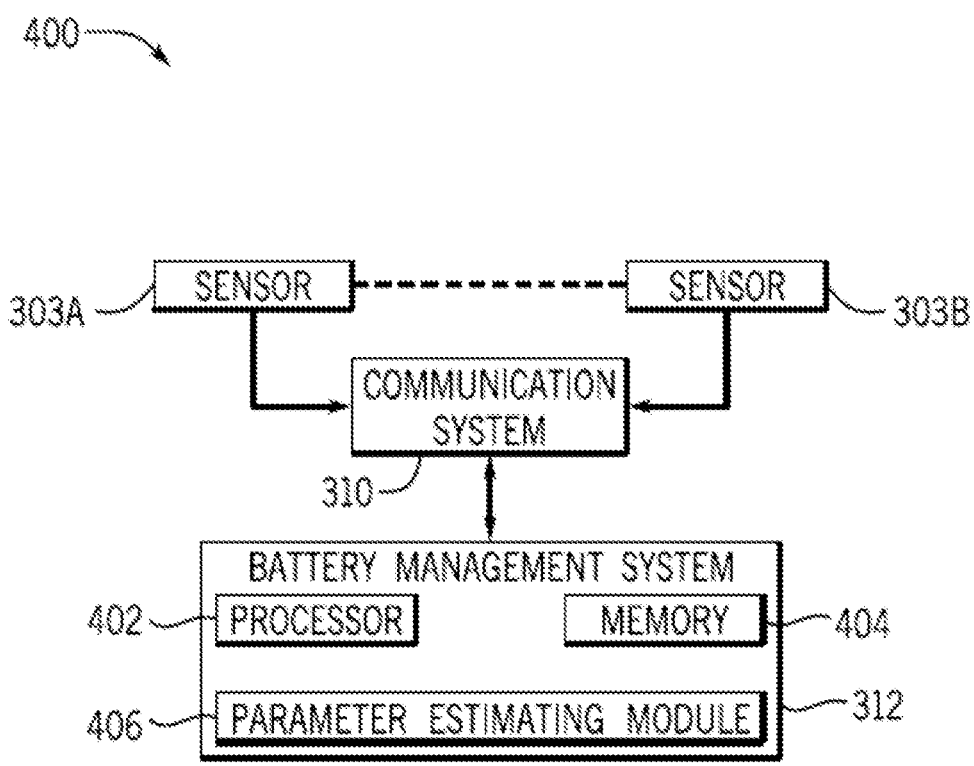
FIG. 8 is block diagram illustrating the coupling of sensors to the battery management system through a communication line unit of the battery pack.

As shown in FIG. 8, battery management system 312 includes a micro-processing unit 402, a memory unit 404, and a parameter estimating module 406. Micro-processing unit 402 can be implemented on a single-chip. For example, various architectures can be used including dedicated or embedded microprocessor (μP), a microcontroller (μC), or any combination thereof. Memory unit 404 may be of any type of memory now known or later developed including but not limited to volatile memory (such as RAM), non-volatile memory (such as ROM, flash memory, etc.) or any combination thereof, which may store software that can be accessed and executed by the processing units, for example.

Figure 9:
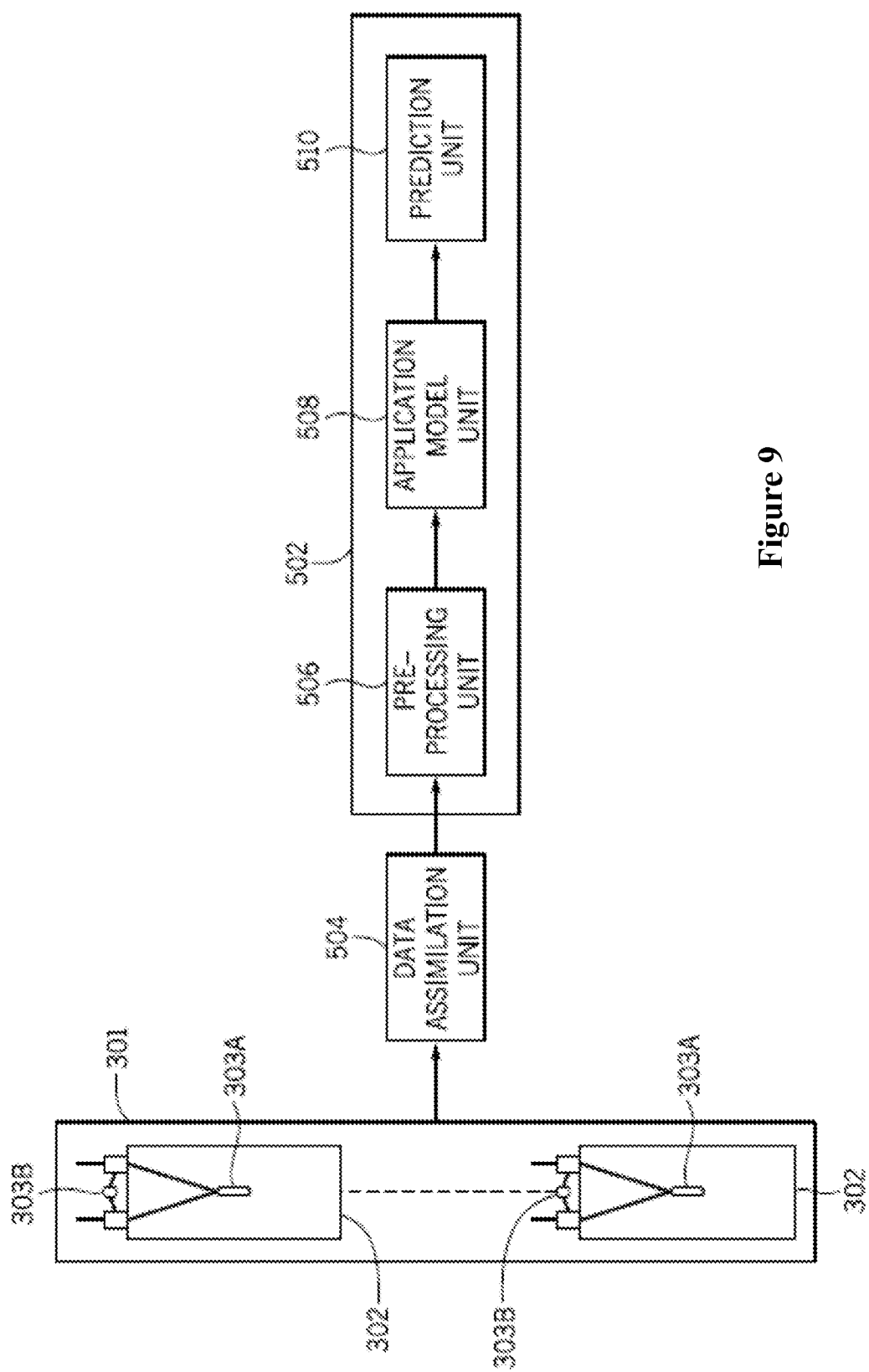
FIG. 9 is a block diagram illustrating an exemplary embodiment of a cell parameter or state prediction system.

Now referring to FIG. 9, an exemplary embodiment of a cell parameter or state prediction system 502 is shown. Prediction system 502 is coupled to a data assimilation unit 504, and includes a pre-processing unit 506, an application of model unit or feature selection unit 508, and a prediction unit 510. Prediction system 502 may be integral to battery controller or to battery management system 312.

In one embodiment, data assimilation unit 504 is configured to receive cell data that was collected by a cell controller (not shown), battery management system 312, or any other measurable data collector. The cell data is provided by one or more sensing units associated with one of cells 1-N. Following its receipt by data assimilation unit 504, the collected data is fitted into a matrix, in which each column (data vector) may include a time series of data. As such, each column may correspond to a particular measurement made by a sensing unit associated with a cell over time. Typically, the data communicated by a sensing unit may be provided in a continuous manner, i.e., in a continuous analog form. As such, data fitted into the matrix may further be converted by an analog to digital (A/D) converter unit. The data matrix is then provided to pre-processing unit 506 that is configured to a prediction model of the battery pack through a learning process, which utilizes and analyzes sensing data collected over time.

Figure 10:
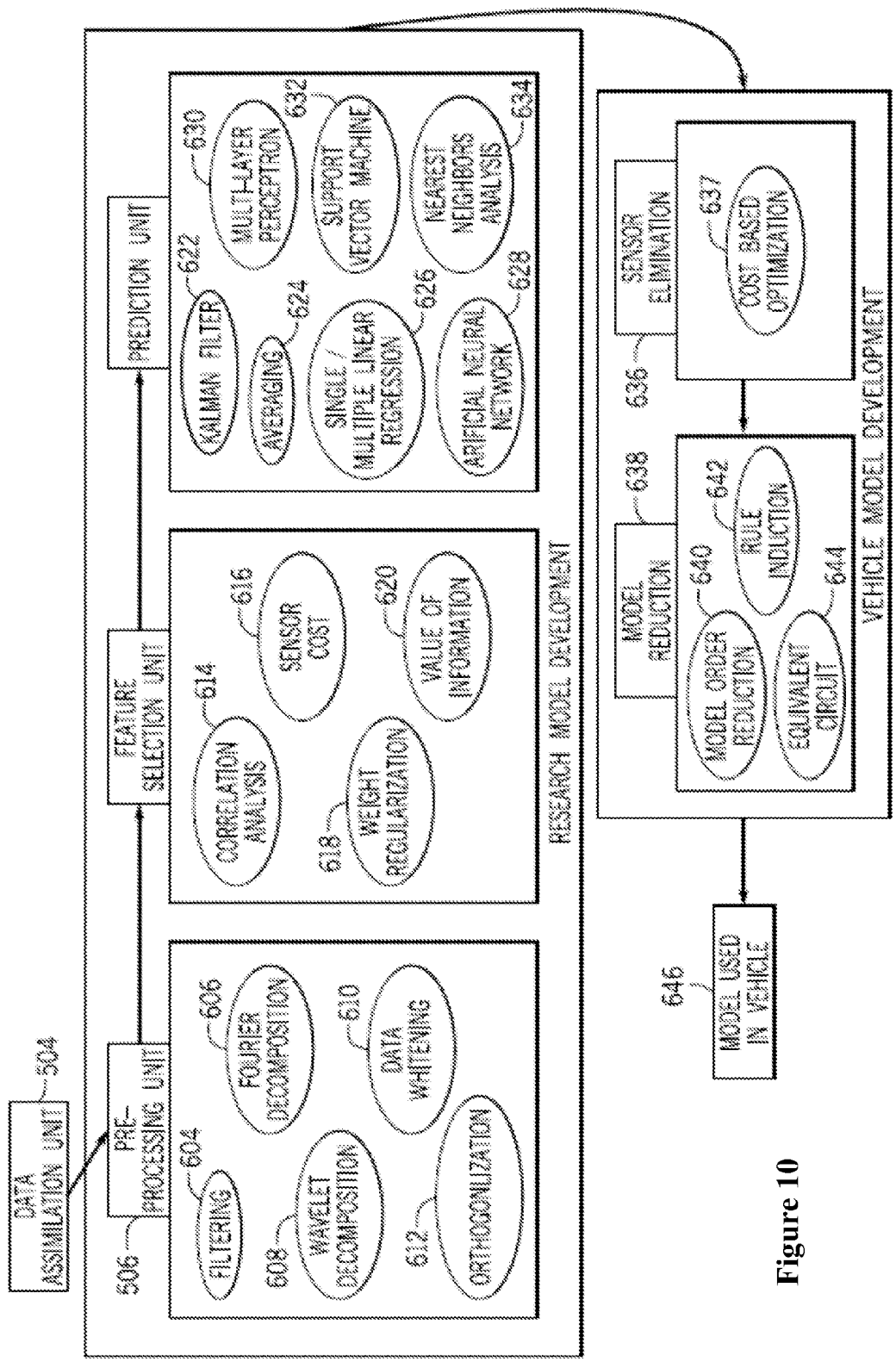
FIG. 10 is a block diagram illustrating a vehicle model development unit that is coupled to the state prediction system of FIG. 9 to generate a battery pack model to be used in the vehicle.

As shown in FIG. 10, pre-processing unit 506 can implement any one of a filtering process 604, a Fourier decomposition process/algorithm 606, a wavelet decomposition process 608, a data whitening process 610, an orthogonalization process 612, any combination of these processes, as well as other data pre-processing techniques. In one embodiment, pre-processing 606 is configured to turn each matrix column into multiple new columns via for example a Fourier analysis, which is configured to decompose a parent signal into multiple frequency components.

Still referring to FIG. 10, feature selection unit 508 can implement any one of a correlation analysis process/algorithm 614 for evaluating correlations between cell parameters and between cells, a sensor cost process 616, a weight regularization process 618, and a value of information process 620 for evaluating the collected data. In one embodiment, feature selection 508 is configured to choose the features that prove to be optimal for a given prediction task.

In one exemplary embodiment, prediction unit 510 may be configured to implement a Kalman filtering process 622, an averaging process 624, a single/multiple regression process 626, an artificial neural network process 628, a multi-layer perceptron process 630, a support vector machine process 632, and a nearest neighbor's analysis process 634. In one embodiment, prediction unit 510 is configured to use one of its processes/algorithms or a combination of multiple algorithms to predict a particular state of a storage device, such as a cell or a capacitor.

In one exemplary embodiment, prediction system 502 is configured to develop a prediction model by initially utilizing a battery pack that has a full set of sensors, i.e., each cell is associated with a complete set of sensors or with a set of sensors that can monitor all of its conditions/states. The prediction model, developed by utilizing data collected over time, is configured to determine which cells correlate with each other, and which measurable parameters of the same cell, of neighboring cells, or of correlated cells correlate with each other. This correlation determination enables a sensor elimination unit 636 to establish which sensors can be removed or eliminated using a cost-based optimization process 637 to optimize manufacturing and/or operation costs of the battery pack while insuring a proper operation of the battery pack. Cost-based optimization process 637 may be optimized to maximize the information retained compared to the cost of the sensors, in which information can be quantified via experimentally determined predictive capacity, or based on Shannon entropy, or via any other quantification of information.

As such, sensor elimination unit 636 enables the development of a battery pack that has an optimum set of sensors for a specified sensor cost budget and is suitable for incorporation in a vehicle. In addition to sensor elimination unit 636, to enhance the development of a vehicle model, a model reduction unit 638 is configured to include a model order reduction unit 640, a rule induction unit 642, and/or an equivalent circuit unit 644. In one exemplary embodiment, model reduction unit 638 is configured to establish a sensor-optimized battery pack model that can be used in a vehicle.

In another embodiment, the correlation determination developed by prediction system 502 can be implemented when a particular sensor fails. During operation, while equipped with a suitable full set of sensors, the battery pack may experience an unexpected failure of one of the sensors. In this scenario, battery management system 312 is configured to identify which condition of this sensor-reduced cell 302B is associated with the failed sensor, and proceed to identify at least one different condition of this sensor-reduced cell 302B that is sensed and other states from the same or other cells that correlate with the no-longer sensed condition in order to predict its value.

Figure 11:
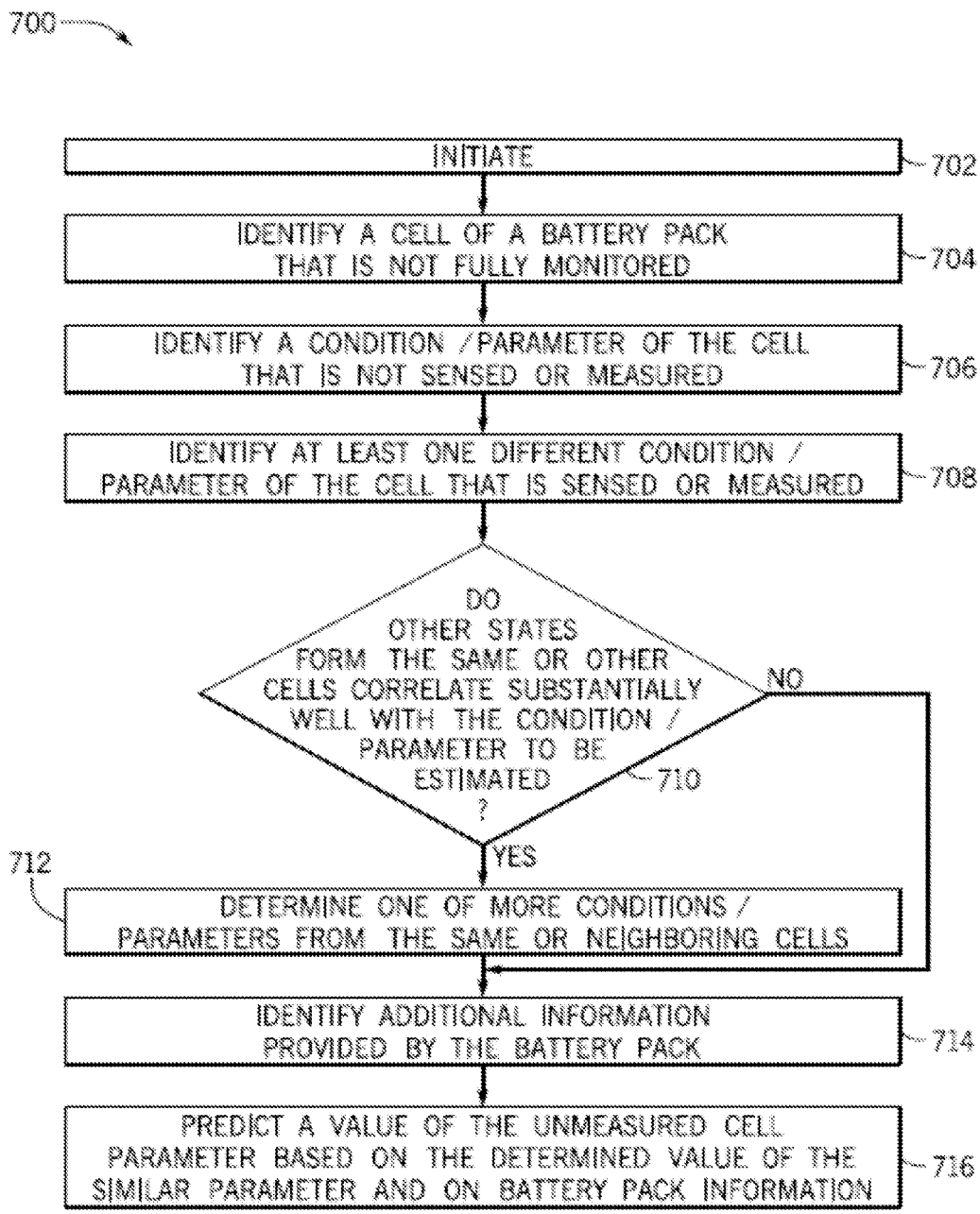
FIG. 11 is a flow chart illustrating a method for estimating conditions of an electrochemical cell with no sensing unit.

Now referring next to FIG. 11, a flow diagram shows an exemplary method 700, initiated at Step 702, for predicting a value of a parameter of a particular cell, the cell being one of a plurality of cells of a battery pack. At Step 704, battery management system 312 is configured to identify one of cells 302B of battery pack 301 that is not fully monitored. At Step 706, battery management system 312 identifies a desired condition/parameter of one of cells 302B that is not sensed or measured. At Step 708, battery management system 312 identifies at least one different condition/parameter of the particular cell 302B that is sensed or measured. Battery management system 312 then determines whether other states from the same or other cells correlate with the condition/parameter to be estimated, at Step 710. In the affirmative, battery management system 312 is configured to determine one or more conditions/parameters from the same or neighboring cells, at Step 712. In addition, battery management system 312 is configured to identify additional information provided by battery pack 301 that relates to the particular cell 302B, i.e., to the desired parameter, at Step 714. Based on determined value of the similar parameter of the neighboring cell 302A, of the determined value of the different parameter of the particular cell 302A, and on the battery pack information, battery management system 312 is configured to predict the desired value of the particular cell 302B.

Figure 12:
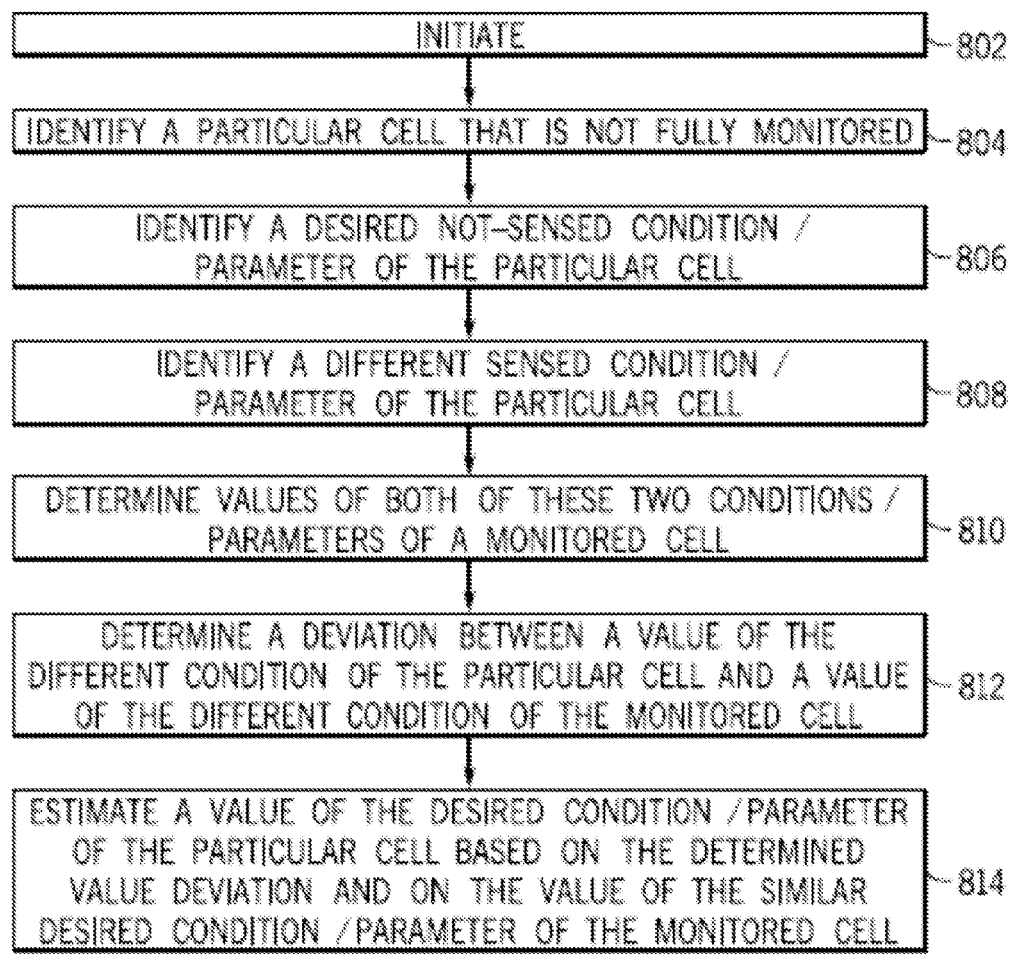
FIG. 12 is a flow chart illustrating a method for estimating a non-sensed condition of a particular cell based on a deviation between a value of a different sensed condition of the particular cell and a value of a similar sensed condition of another cell.

In one embodiment, the prediction of a value of a non-sensed condition of a cell 302B may be derived based on a value of the same but sensed condition of another cell 302B and on a deviation between a value of a different and sensed condition that correlates in a substantial manner with the non-sensed condition and a value of a similar different and sensed condition of the other cell 302B. Now referring to FIG. 12, a flow diagram shows an exemplary method 800, initiated at Step 802, for predicting a value of a non-sensed condition/parameter of a particular cell. At Step 804, battery management system 312 is configured to identify a particular cell 302B that is not fully monitored. At Step 806, battery management system 312 identifies a desired condition/parameter of the particular cell 302B that is not sensed or measured. At Step 808, battery management system 312 identifies a different condition of the particular cell 302B that is sensed and that correlates in substantial manner with the desired condition. At Step 810, battery management system 312 identifies both of these conditions of a monitored cell 302A of the battery pack. Subsequently, battery management system 312 is configured to determine a deviation between a value of the different condition/parameter of the particular cell 302B and a value of the different condition/parameter of the monitored cell 302A, at Step 812. Then, at Step 814, battery management system 312 is configured to estimate the desired condition/parameter of the particular 302B based the determined deviation and on the value of the similar condition/parameter of the monitored cell 302A.

Figure 13:
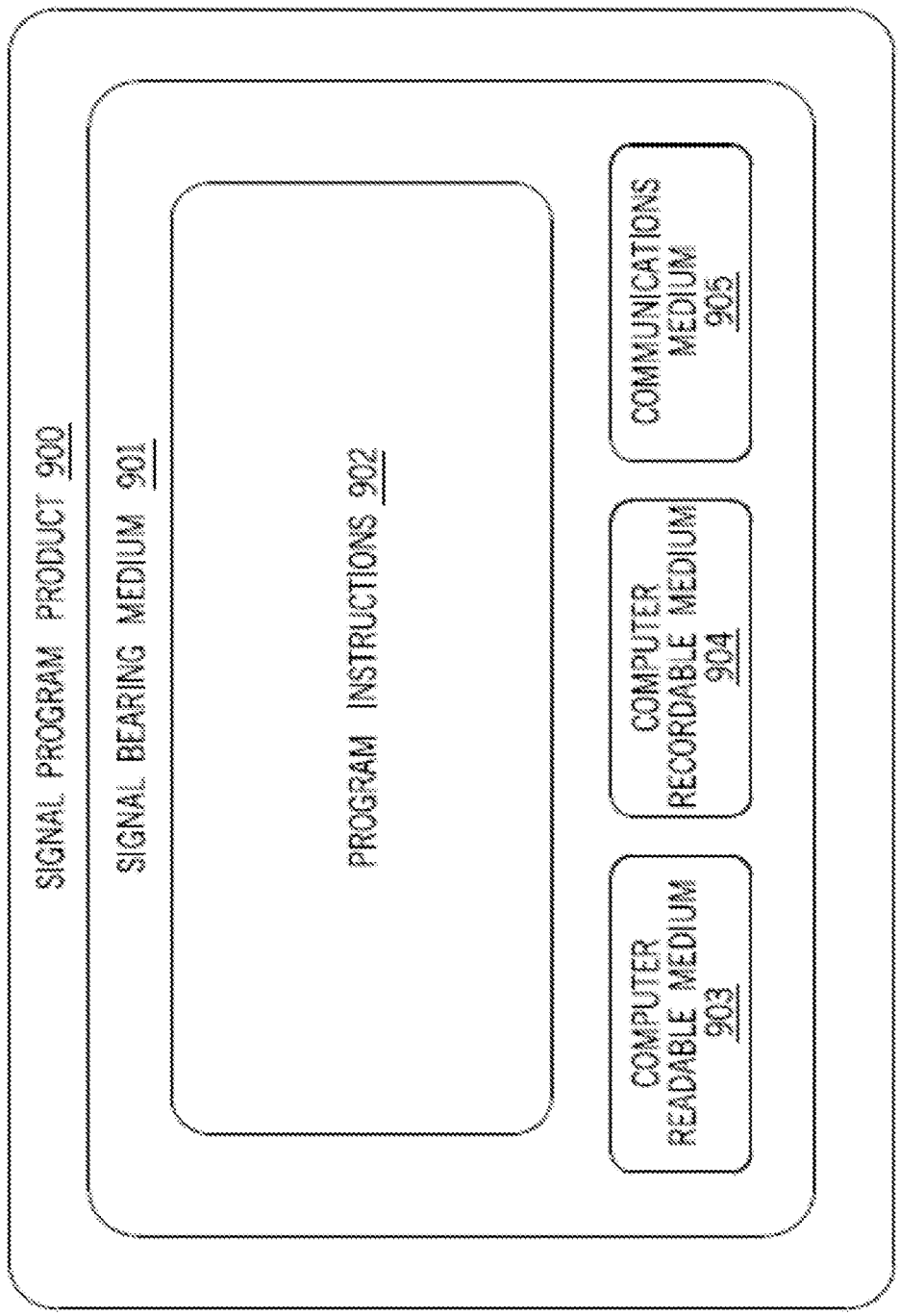
FIG. 13 is a schematic diagram illustrating a conceptual partial view of an example computer program product.

In some embodiments, the disclosed method may be implemented as computer program instructions encoded on a computer-readable storage media in a machine-readable format. FIG. 13 is a schematic illustrating a conceptual partial view of an example computer program product 901 that includes a computer program for executing a computer process on a computing device, arranged according to at least some embodiments presented herein. In one embodiment, the example computer program product 901 is provided using a signal bearing medium 902. The signal bearing medium 902 may include one or more programming instructions 902 that, when executed by a processing unit may provide functionality or portions of the functionality described above with respect to FIGS. 11 and 12. Thus, for example, referring to the embodiment shown in FIGS. 11 and 12, one or more features of blocks 702-714 and 802-1214, may be undertaken by one or more instructions associated with the signal bearing medium 902.

In some examples, signal bearing medium 901 may encompass a non-transitory computer-readable medium 904, such as, but not limited to, a hard disk drive, memory, etc. In some implementations, signal bearing medium 902 may encompass a computer recordable medium 905, such as, but not limited to, memory, read/write (R/W) CDs, R/W DVDs, etc. In some implementations, signal bearing medium 902 may encompass a communications medium 906, such as, but not limited to, a digital and/or an analog communication medium (e.g., a fiber optic cable, a waveguide, a wired communications link, etc.).

One or more of the disclosed embodiments, alone or in combination, may provide one or more technical effects useful in the prediction of a value of a non-sensed condition of cell of a battery pack. The technical effects and technical problems in the specification are exemplary and are not limiting. It should be noted that the embodiments described in the specification may have other technical effects and can solve other technical problems.

While only certain features and embodiments of the disclosure have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

What is claimed is:

1. A method for predicting a value of an unmeasured parameter of a first cell of a battery pack using a battery management system (BMS) of the battery pack, the first cell being one of a plurality of cells of the battery pack, the method comprising:
identifying, using a processor of the BMS, a measured parameter of a second cell of the plurality of cells that is correlated with the unmeasured parameter of the first cell in a memory of the BCM;
determining, using a sensor of the battery pack that is operably coupled to the second cell and to the processor of the BMS, a value for the measured parameter of the second cell; and
predicting, using the processor of the BMS, the value of the unmeasured parameter of the first cell based at least in part on the determined value of the measure parameter of the second cell, wherein the unmeasured parameter of the first cell comprises an internal temperature, an external temperature, an internal pressure, a voltage, a current, or a lithium intercalation pressure of the first cell.

2. The method of claim 1, further comprising:
determining, using the processor of the BMS, a value of a parameter of the battery pack that is correlated with the the unmeasured parameter of the first cell in the memory of the BMS, wherein the processor of the BMS predicts the value of the unmeasured parameter of the first cell based at least in part on the determined value of the parameter of the battery pack.

3. The method of claim 1, wherein the first cell and the second cell of the plurality of cells are neighboring cells in the battery pack.

4. The method of claim 1, wherein the first cell and the second cell are separate and distinct cells of the plurality of cells of the battery pack.

5. The method of claim 1, comprising estimating, via the processor of the BMS, a state of charge of the first cell using the predicted value of the unmeasured parameter of the first cell.

6. A battery management system (BMS) of a battery pack, comprising:
a processing unit and a memory unit for storing instructions that are operable, when executed by the processing unit, to perform a method for predicting a value of an unmeasured parameter of a first cell of a plurality of cells of the battery pack, the method comprising:
identifying, using the processing unit, a measured parameter of a second cell of the plurality of cells that is correlated with the unmeasured parameter of the first cell in the memory unit of the BMS;
determining, using a sensor of the battery pack that is operably coupled to the second cell and to the processing unit of the BMS, a value for the measured parameter of the second cell; and
predicting, using the processing unit of the BMS, the value of the unmeasured parameter of the first cell based at least in part on the determined value of the measure parameter of the second cell, wherein the unmeasured parameter of the first cell comprises an internal temperature, an external temperature, an internal pressure, a voltage, a current, or a lithium intercalation pressure of the first cell.

7. The BMS of claim 6, further comprising:
determining a value of a parameter of the battery pack that is correlated with the unmeasured parameter of the first cell in the memory unit of the BMS, wherein the processor of the BCM predicts the value of the unmeasured parameter of the first cell based at least in part on the determined value of the parameter of the battery pack.

8. The BMS of claim 6, wherein the first cell and the second cell of the plurality of cells are neighboring cells in the battery pack.

9. The BMS of claim 6, wherein the first cell and the second cell are separate and distinct cells of the plurality of cells of the battery pack.

10. The BMS of claim 6, wherein the method further comprises using the predicted value of the unmeasured parameter of the first cell to estimate the state of charge of the first cell.

11. A battery pack, comprising: a first cell coupled with a corresponding sensing unit configured to measure a value of a parameter of the first cell; a second cell that is not coupled with a sensing unit; and a battery management system (BMS) coupled to each corresponding sensing unit coupled with the first cell, wherein the BMS includes a processor and a memory storing a prediction model that defines correlations between the parameters of the first cell and unmeasured parameters of the second cell, and wherein the processor is configured to use the prediction model to predict values for the unmeasured parameters of the second cell based at least in part on the measured values of the parameters of the first cell.

12. The battery pack of claim 11, wherein the prediction model defines correlations between measured parameters of the battery pack and the unmeasured parameters of the second cell, and wherein the processor is configured to use the prediction model to predict values for the unmeasured parameters of the second plurality of cells based at least in part on the measured parameters of the battery pack.

13. The battery pack of claim 11, wherein the BMS is configured to use the predicted values of the unmeasured parameters of the second cell to estimate a state of charge of the second cell.

14. The battery pack of claim 11, wherein the unmeasured parameters of the second cell comprise an internal temperature, an external temperature, an internal pressure, a voltage, a current, or a lithium intercalation pressure of the second cell.

15. The battery pack of claim 11, wherein the second cell is not coupled with the sensing units to minimize a cost of the battery pack.

16. The method of claim 1, wherein the unmeasured parameter of the first cell is the internal pressure or the lithium intercalation pressure.

17. The method of claim 5, comprising cell balancing, via the processor of the BMS, of the plurality of cells based at least in part on the estimated state of charge of the first cell.

18. The method of claim 5, comprising estimating, via the processor of the BMS, a state of charge of the battery pack based at least in part on the estimated state of charge of the first cell.

19. The method of claim 18, comprising outputting, via the processor of the BMS, the estimated state of charge of the battery pack to a vehicle control module (VCM) of an xEV, wherein the VCM determines when to charge and discharge the battery pack based at least in part on the estimated state of charge of the battery pack.

\* \* \* \* \*